United States Patent [19]
Ouchi et al.

[11] Patent Number: 5,701,325
[45] Date of Patent: Dec. 23, 1997

[54] COMPOUND SEMICONDUCTOR DEVICE AND FABRICATION METHOD OF PRODUCING THE COMPOUND SEMICONDUCTOR DEVICE

[75] Inventors: Toshihiko Ouchi, Machida; Hajime Sakata, Atsugi; Noriaki Ohguri, Zama; Mamoru Uchida, Yokohama, all of Japan

[73] Assignee: Canon Kabushiki Kaisha, Tokyo, Japan

[21] Appl. No.: 731,682

[22] Filed: Oct. 16, 1996

Related U.S. Application Data

[63] Continuation of Ser. No. 64,884, May 24, 1993, abandoned.

[30] Foreign Application Priority Data

Jun. 4, 1992 [JP] Japan .................. 4-170194
Apr. 9, 1993 [JP] Japan .................. 4-107746

[51] Int. Cl.$^6$ .................. H01S 3/08; H01S 3/18; H01L 21/20
[52] U.S. Cl. .................. 372/96; 372/43; 372/102; 437/129
[58] Field of Search .................. 372/96, 102, 19, 372/20, 50, 45, 43; 437/129; 359/575, 576

[56] References Cited

U.S. PATENT DOCUMENTS

| | | | |
|---|---|---|---|
| 4,729,640 | 3/1988 | Sakata | 350/348 |
| 4,847,857 | 7/1989 | Ohkura | 372/96 |
| 4,850,681 | 7/1989 | Yamanobe et al. | 350/348 |
| 5,040,188 | 8/1991 | Long et al. | 372/96 |
| 5,070,509 | 12/1991 | Meyers et al. | 372/96 |
| 5,088,097 | 2/1992 | Ono et al. | 372/96 |
| 5,091,916 | 2/1992 | Cimini, Jr. et al. | 372/96 |
| 5,220,573 | 6/1993 | Sakata et al. | 372/102 |
| 5,271,030 | 12/1993 | Chinen | 372/96 |

FOREIGN PATENT DOCUMENTS

| | | | |
|---|---|---|---|
| 61-202487 | 9/1986 | Japan | 372/96 |
| 0255085 | 11/1986 | Japan | 372/20 |
| 0150794 | 7/1987 | Japan | 372/96 |
| 3248492 | 11/1991 | Japan . | |
| 5343791 | 12/1993 | Japan . | |
| 2151402 | 7/1985 | United Kingdom | H01S 3/19 |

OTHER PUBLICATIONS

Stoll et al., "Multiply Resonant Distributed Feedback Lasers", IEEE Journal of Quantum Electronics, vol. QE-12, No. 1, Jan. 76.

Nakano et al., "AlGaAs/GaAs Visible Distributed Feedback Laser Operating at 770nm", in Electronics Letters, vol. 23, No. 25, Dec. 1987, pp. 1342-1343.

Patent Abstracts of Japan, vol. 15, No. 241 (kokai 3-076289) Jun. 1991.

*Primary Examiner*—Rodney B. Bovernick
*Assistant Examiner*—Luong-Quyen T. Phan
*Attorney, Agent, or Firm*—Fitzpatrick, Cella, Harper & Scinto

[57] ABSTRACT

An improved compound semiconductor device, such as a distributed Bragg reflection type or distributed feedback type laser device, having regions with and regions without a diffraction grating. The device is fabricated without exhibiting surface irregularities by growing a first epitaxial layer on a semiconductor substrate, forming a fine uneven structure on the surface of the first epitaxial layer and growing a second epitaxial layer on the fine uneven structure. The fine uneven structure has a surface shape which exposes crystal orientations that facilitate subsequent epitaxial growth. In one embodiment, portions of the fine uneven structure are formed as a diffraction grating while other portions are formed insufficiently uneven to have a diffraction effect for any usable light wavelength. The fine uneven structure may suitably be shallow, have a short pitch or be provided at a slant to the light propagation direction, in order to preclude a diffraction effect.

41 Claims, 10 Drawing Sheets

COMPOUND SEMICONDUCTOR DEVICE AND FABRICATION METHOD OF PRODUCING THE COMPOUND SEMICONDUCTOR DEVICE

This application is a continuation of application Ser. No. 08/064,884 filed May 24, 1993, which is now abandoned.

BACKGROUND OF THE INVENTION

1. Field of the Invention

The present invention relates to a fabrication method for producing a compound semiconductor device from material in the AlGaAs/GaAs series or the like in which a material such as AlGaAs and GaAs is regrown over a material such as AlGaAs, which has been once exposed to atmosphere, and a compound semiconductor device produced by using such a fabrication method.

2. Related Background Art

When devices such as a semiconductor laser, which include a grating, are fabricated, a regrowth technique should be necessarily utilized on a wafer after the wafer has been once exposed to atmosphere and further processed. Especially, in the case of a tunable distributed Bragg reflection (DBR) type laser which is, as shown in FIG. 1, provided with a region with a diffraction grating 545 and a region without such a grating and in which current is injectable into the region with the diffraction grating 545, the fabrication process is complicated.

In FIG. 1, reference numeral 531 designates a AlGaAs substrate. On the substrate 531, an n-AlGaAs cladding layer 532, an active layer 533, a p-AlGaAs carrier confinement layer 534, a p-AlGaAs light guide layer 535, a p-AlGaAs cladding layer 536 and a contact layer 537 are formed in the named order.

Two p-electrodes 540 and 542 are formed on the divided contact layer 537, and an n-electrode 543 is formed on the bottom surface of the substrate 531.

FIG. 2 shows a cross-section of a DBR laser device fabricated by a prior art method. FIGS. 3A–3F show fabrication steps of such a prior art fabrication method. The fabrication method will be described.

In FIG. 3A, on the n-GaAs substrate 531, n-AlGaAs cladding layer 532, active layer 533, p-AlGaAs carrier confinement layer 534, p-AlGaAs light guide layer 535, p-AlGaAs cladding layer 536, and contact layer 537 are grown by a conventional molecular beam epitaxy (MBE) method or the like. Thus, a laser structure is fabricated. Next, as shown in FIG. 3B, a region which will not include a diffraction grating 545 is covered with a resist 539, and the remaining region is etched down to the light guide layer 535.

Then, as illustrated in FIG. 3C, a diffraction grating resist 538, which is different from the resist 539, is patterned, and another etching process is performed to form the diffraction grating 545 solely on the light guide layer 535, as shown in FIG. 3D. Resists 538 and 539 are removed as illustrated in FIG. 3E. Then, as shown in FIG. 3G, p-AlGaAs cladding layer 536 and contact layer 537 are selectively regrown only on the region with the diffraction grating 545 by using a conventional liquid phase epitaxy (LPE) method or the like.

Thus, when a semiconductor laser with a diffraction grating is fabricated, it is necessary to expose a wafer to atmosphere once and then perform a regrowth process on the wafer after the wafer is subjected to, for example, a grating forming process.

However, when a wafer is fabricated using the producing method described with reference to FIGS. 3A–3F, a regrowth boundary is likely to have a step 550 as shown in FIG. 2, and thus an uneven surface appears on the wafer. As a result, patterning will be difficult to achieve in a later burying process step (e.g., in order to fabricate a lateral confinement structure, a stripe-shaped pattern is formed and etching is conducted with this pattern used as a mask, and then a regrowth is carried out), an electrode forming step (e.g., the stripe-shaped electrodes 540 and 542 as shown in FIG. 1 are formed), and other steps. Further, when the wafer is mounted to a heat sink in a p-side down manner (i.e., an upper side of the wafer near the active layer 533 is mounted to a heat sink), the problem of deteriorated thermal contact occurs.

The step 550 appears because the growth speed on a side surface (e.g., a side surface 551 of the etched cladding layer 536 shown in FIG. 3E) of the crystal is greater than the growth speed on a flat surface of the crystal. A difference in growth speed can be reduced under appropriate conditions in a conventional metal organic chemical vapor deposition (MOCVD) method, but the step 550 cannot be completely eliminated.

Further, as shown in FIG. 3C, the resist 538 accumulates at a boundary corner of the etched light guide layer 535 and the layer thickness of resist 538 thereat increases. Thus, an area occurs where the diffraction grating 545 cannot be formed, as shown in FIG. 3D. Consequently, a designed structure cannot be fully fabricated.

In the above-discussed fabricating method, the diffraction grating 545 is formed after the active layer 533 is grown, so the problem also occurs that the active layer 533 is likely to be subjected to process damage.

To solve this problem, the following method is considered preferable: After a first growth process up to the light guide layer 535, the diffraction grating 545 is partially formed on a flat surface and then regrowth is executed. Such a method is possible in the case of material in the InP series. In the case of material in the GaAs series, however, if the light guide layer 535 consists of AlGaAs, nucleation and growth of the cladding layer 536 and the like occur only on the surface portion in which the diffraction grating 545 is formed, as shown in FIG. 4. This result is caused by a growth mechanism specific to LPE in which regrowth is difficult on an AlGaAs (100) surface due to the effect of oxidization while a regrowth is possible on a region in which the diffraction grating 545 is formed because crystal surfaces other than the (100) surface are exposed.

Further, a crystal often needs to be regrown on a grating having a relatively coarse pitch of about 10 μm, in a semiconductor grating filter as shown in FIG. 5 (see, for example, (1) R. C. Alferness et al., Appl. Phys. Lett., 55, 2013 (1988), and (2) Sakata et al., informal paper C-247 delivered in Vernal Grand Conference of Japan Electronics Information Communication Academy, (1990)). In the case of article (1), there is no difficulty with regrowth on the diffraction grating since the material is in the InAlGaAs/InP series. Further, a degree of freedom in design is great, and current is injectable into a region with the diffraction grating. On the other hand, in the case of article (2), the material is in the AlGaAs series. Regrowth on a diffraction grating with a coarse pitch is hard to perform when the crystal surface is AlGaAs. In FIGS. 5 and 6, reference numeral 640 designates a lower waveguide, reference numeral 641 designates an upper waveguide, and reference numeral 601 designates a cladding layer.

If a diffraction grating with a coarse pitch is formed on an AlGaAs surface and regrowth is performed by LPE, as described above, nucleation and growth occur as shown in FIG. 6. In FIG. 6, reference numeral 642 designates a LPE crystal layer formed by the nucleation and growth. Therefore, fabrication yield, flatness, crystal quality and the like are exceedingly bad, so that a device cannot be practicably fabricated. This result is also caused by the above-mentioned growth mechanism specific to LPE.

As a result, no current is injectable into the diffraction grating region, and hence filtering or selection wavelength cannot be changed. Further, a grating cannot be formed between two waveguides, and hence a degree of freedom in design, such as waveguide structure and coupling length, is limited.

SUMMARY OF THE INVENTION

It is an object of the present invention to provide a method of producing a compound semiconductor device, which has a structure difficult to fabricate by a conventional fabrication method, by making a positive use of the above-discussed specific characteristics of epitaxial growth methods such as LPE, and a compound semiconductor device which has a structure that makes it possible to utilize such a fabrication method.

According to one aspect of the fabrication method of producing a compound semiconductor device, the method comprises a first growth step of performing an epitaxial growth on a semiconductor substrate in a growth furnace to form a wafer, an interruption step of once interrupting the epitaxial growth and removing the wafer formed in the first growth step from the growth furnace, and a second growth step of putting the wafer processed in the interruption step into the growth furnace and performing a second growth on a fine uneven structure of the wafer. The interruption step includes an uneven structure forming step of forming the fine uneven structure on an epitaxial crystalline surface of the wafer, on which the second growth is desired, formed in the first growth step.

According to another aspect of the fabrication method of producing a compound semiconductor device, the method comprises a first growth step of performing a first growth to form a wafer having an epitaxial crystal surface, an interruption step of once interrupting the first growth, and a second growth step of performing a second growth on superposed fine uneven structures of the wafer. The interruption step includes an uneven structure forming a step of forming at least one kind of the fine uneven structure on the epitaxial crystal surface of the wafer, on which the second growth is desired formed in the first growth step.

According to another aspect of the fabrication method of producing a compound semiconductor device, the method comprises a first growth step of performing a first growth to form a wafer having an epitaxial crystal surface, an interruption step of once interrupting the first growth, and a second growth step of performing a second growth on superposed fine uneven structures of the wafer. The interruption step includes an uneven structure forming step of forming at least two kinds of the fine uneven structures on the epitaxial crystal surface of the wafer formed in the first growth step and the fine uneven structures are superposed on the common epitaxial crystal surface of the wafer.

According to one aspect of a compound semiconductor device of the present invention, the device comprises a semiconductor substrate, a first growth epitaxial-layer structure formed on the substrate and having an epitaxial crystal surface, at least one kind of fine uneven structure formed on the entire epitaxial crystal surface of the first growth epitaxial-layer structure, and a second growth epitaxial-layer structure formed on the fine uneven structure.

According to another aspect of the compound semiconductor device of the present invention, the device (a distributed feedback or Bragg reflection type device which is usable as a laser filter, etc.) comprises a semiconductor substrate, a first growth epitaxial-layer structure formed on the substrate and having an epitaxial crystal surface, a plurality of kinds of diffraction gratings of predetermined pitches formed on the entire epitaxial crystal surface of the first growth epitaxial-layer structure, a second growth epitaxial-layer structure formed on the diffraction gratings, and an active region formed in one of the first and second growth epitaxial-layer structures. At least one of the diffraction gratings is formed so as not to have a diffraction effect for light propagated in the laser device.

According to another aspect of the compound semiconductor device of the present invention, the device comprises a semiconductor substrate, a first growth epitaxial-layer structure formed on the substrate and having a common epitaxial crystal surface, at least two kinds of fine uneven structures formed on the epitaxial crystal surface of the first growth epitaxial-layer structure, and a second growth epitaxial-layer structure formed on the fine uneven structures. The fine uneven structures are superposed on the common epitaxial crystal surface.

These advantages and others will be more readily understood in connection with the following detailed description of the preferred embodiments in conjunction with the drawings.

DESCRIPTION OF THE PREFERRED EMBODIMENT

First Embodiment

Figure 8A:
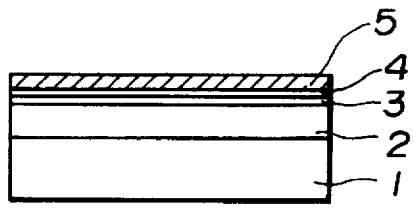
FIGS. 8A-8G are views respectively showing steps of a first embodiment of a producing method according to the present invention.

A first embodiment of a fabrication method of the present invention is applied to the fabrication of a DBR laser from material in the AlGaAs/GaAs series. As shown in FIG. 8A, an n-GasAs buffer layer (not shown) of a thickness of 0.5 μm, an n-$Al_xGa_{1-x}As$ (x=0.4) carrier confinement layer 4 of a thickness of 400 Å, and a p-$Al_xGa_{1-x}As$ (x=0.15) light guide layer 5 of a thickness of 0.25 μm are grown, in this order, on an n-GaAs substrate 1, by an MBE method. The active layer 3 is composed of three sets of GaAs quantum well layers (thickness if 60 Å) and $Al_xGa_{1-x}As$ (x=0.2) barrier layers (thickness is 100 Å) interposed between the well layers. Outside of the three sets of well layers and barrier layers, graded index separate confinement heterostructure (GRIN-SCH) layers of a thickness of 500 Å, in which an Al mole fraction is gradually varied, are built up.

Figure 8E:
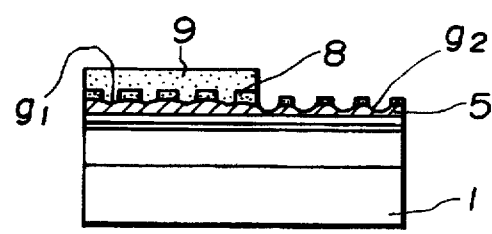
Figure 8B:
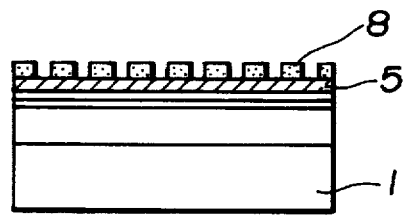
Figure 8F:
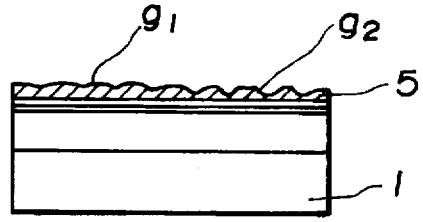
Figure 8C:
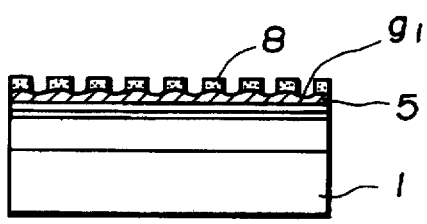

Next, as shown in FIG. 8B, a resist (e.g., AZ1350J (produced by Hoeschst AG):thinner=1:10) 8 is deposited on the light guide layer 5, and patterning is performed by a two-beam interference exposure method, using a He-Cd laser. In FIG. 8C, a diffraction grating $g_1$ having a pitch of 2440 Å and a depth of 10 Å is formed by etching using reactive ion beam etching (RIBE) method.

Figure 8G:
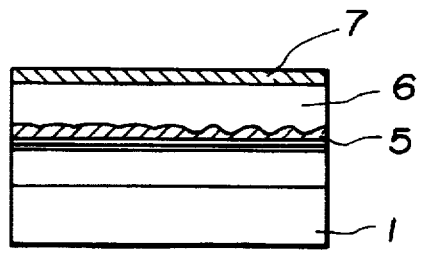
Figure 8D:
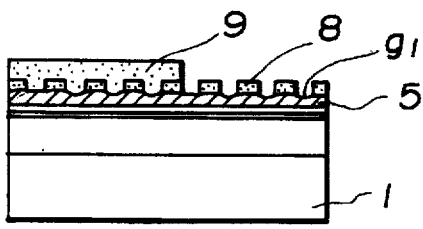

In FIG. 8D, another resist (e.g., OMR 87 produced by Tokyo Ohka Kogyo K. K.) 9 which is different from the above resist 8 used in the two-beam interference exposure is patterned. The pattern is stripe-shaped and parallel to the diffraction grating $g_1$. In FIG. 8E, resists 8 and 9 are removed after a diffraction grating $g_2$ having a depth of 1000 Å is formed by etching using RIBE method. As a result, the diffraction gratings $g_1$ and $g_2$ having the same pitch and different depths are formed on the entire surface of the wafer (see FIG. 8F).

Then, as shown in FIG. 8G, a p-$Al_xGa_{1-x}As$ (x—0.45) cladding layer 6 of a thickness of 1.5 μm and a p-GaAs contact layer 7 of a thickness of 0.5 μm are regrown on the light guide layer 5 over the diffraction gratings and $g_2$ by using the LPE method.

Since an uneven structure for facilitating the regrowth is formed on the overall light guide layer 5 (i.e., a portion where the regrowth should by executed), the cladding layer 6 and the contact layer 7 can be readily layered with high quality.

Figure 1:
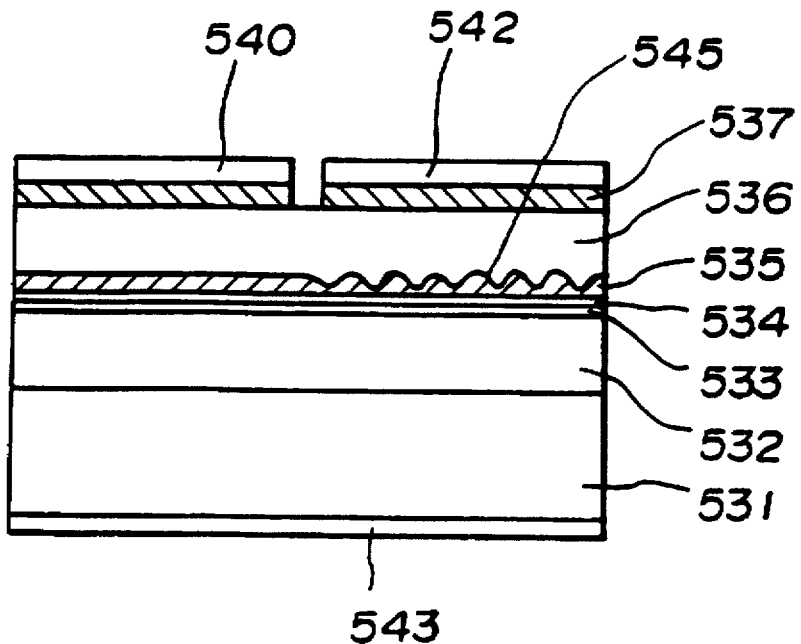
FIG. 1 is a cross-sectional view of a distributed Bragg reflection (DBR) type laser device.
Figure 2:
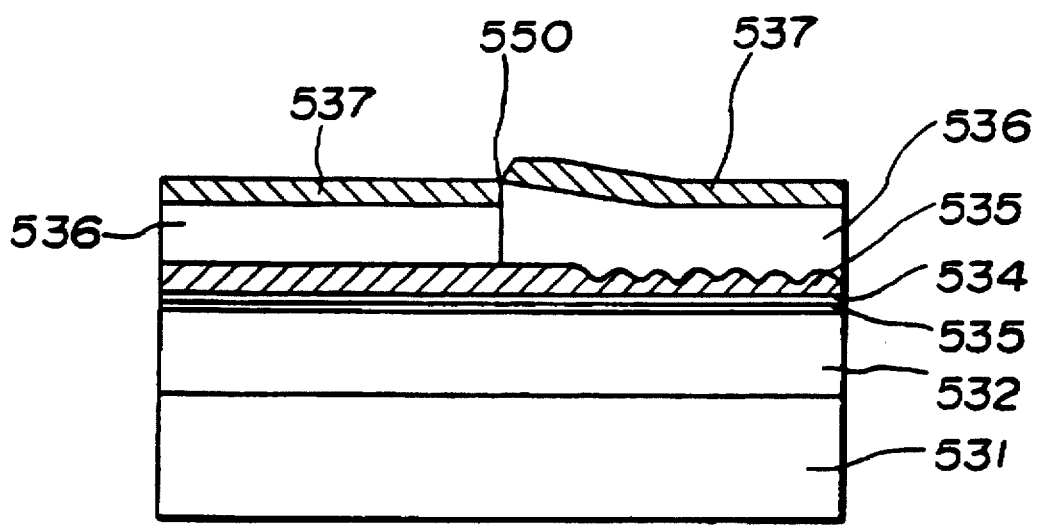
FIG. 2 is a cross-sectional view showing an example of a semiconductor device fabricated by a conventional producing method.
Figure 3A:
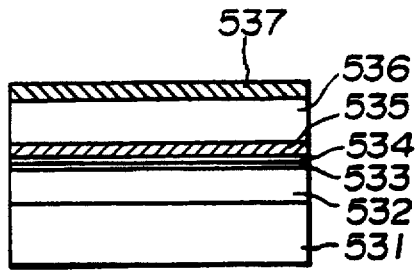
FIGS. 3A-3F are views respectively showing steps of a conventional producing method.
Figure 3D:
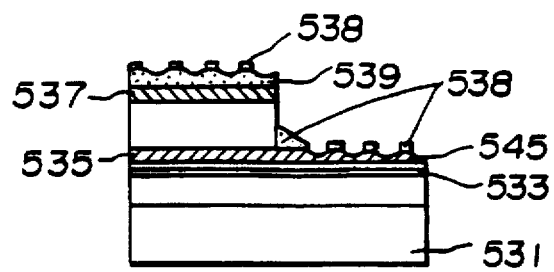
Figure 3B:
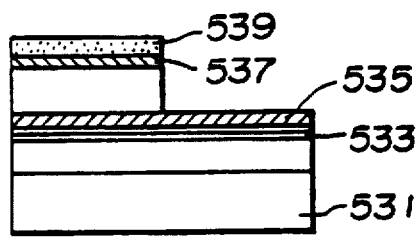
Figure 3E:
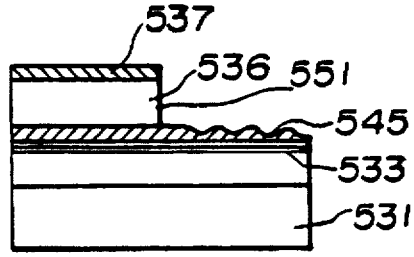
Figure 3C:
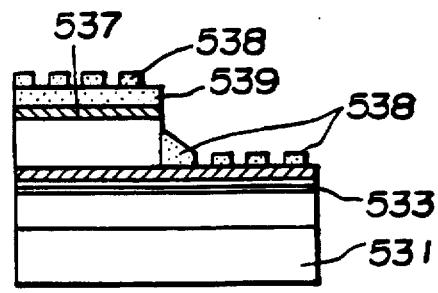
Figure 3F:
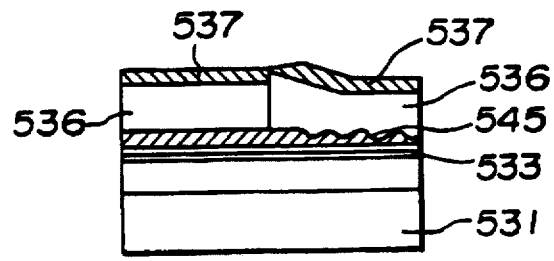
Figure 4:
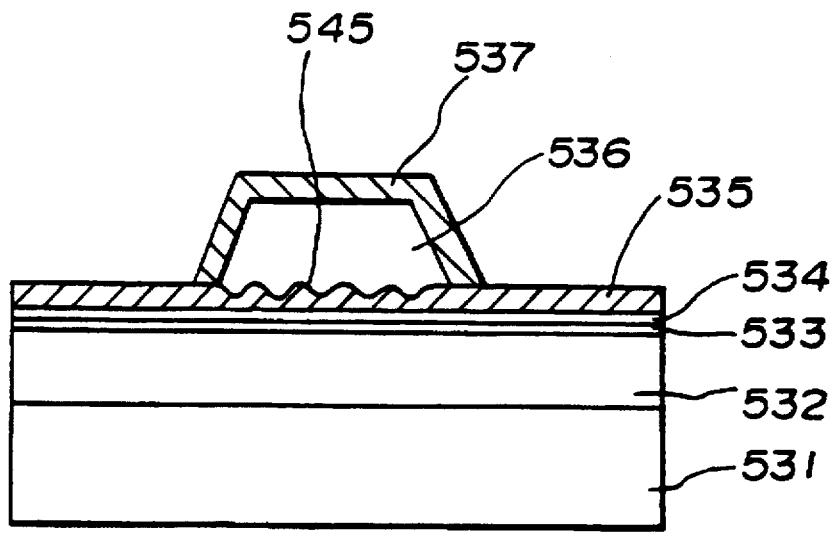
FIG. 4 is a cross-sectional view of a prior art device after a regrowth process.
Figure 5:
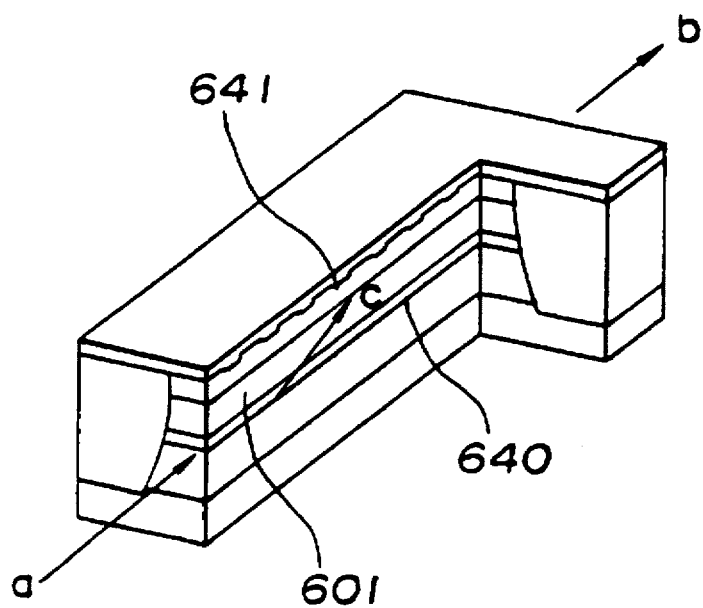
FIG. 5 is a perspective view showing a prior art semiconductor grating filter.
Figure 6:
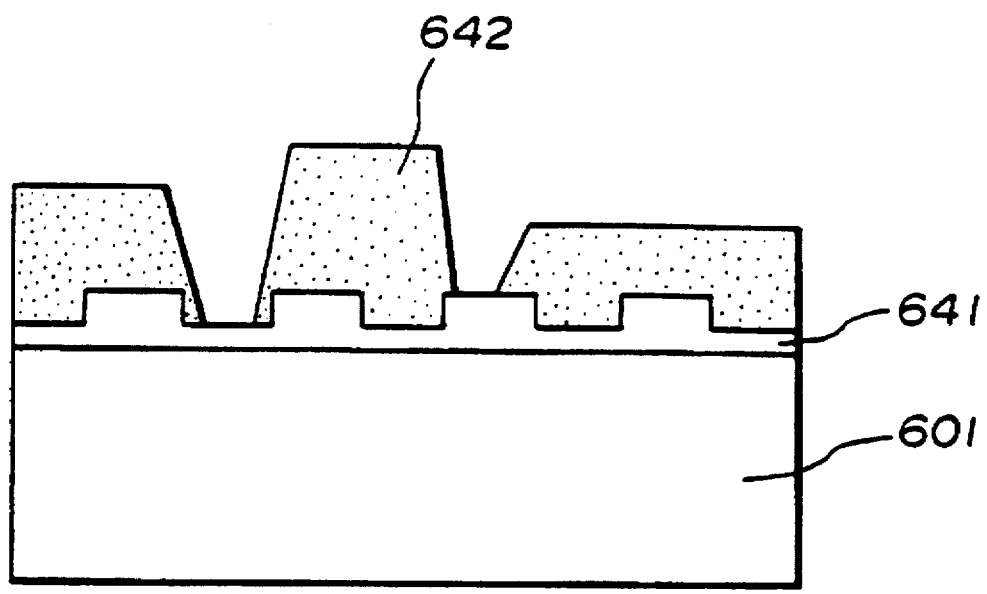
FIG. 6 is a cross-sectional view showing a prior art regrowth method.
Figure 7:
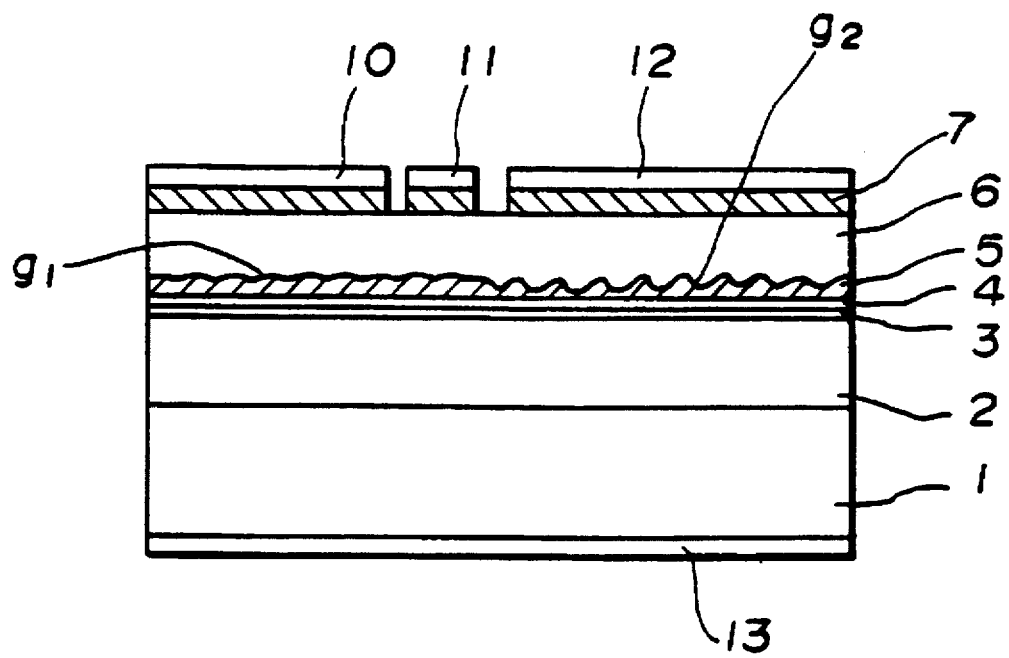
FIG. 7 is a cross-sectional view showing a first embodiment of semiconductor device fabricated by a producing method of the present invention.

After electrodes 10, 11, 12 and 13 are formed, a DBR laser having completely flat interface and surface as shown in FIG. 7 is attained.

The function of the thus fabricated device will be described.

When the device is caused to function as a DBR device, a laser driving current is injected into the electrodes 10 and 11 shown in FIG. 7. When current is injected into the electrode 12, the effective refractive index of the distributed reflector portion (i.e., a portion where the diffraction grating $g_2$ is formed) is changed and the selection reflective wavelength is varied. Hence, the oscillation wavelength of the DBR device can be altered through a range of several nanometers. In order to suppress mode hopping, the current injected into the electrode 11, formed over a phase adjusting area, is varied to adjust the phase.

In such a driving mode, if current, which is a little smaller than the laser oscillation threshold, is injected, incident light will be amplified in the areas below the electrodes 10 and 11 when the light's wavelength is near the laser oscillation wavelength. The area, where the electrode 12 is formed, has the capacity for wavelength selectivity. The selection wavelength is variable, so that the device can act as a tunable filter. The half width of the filtering spectrum is 0.5 nm, the tunable width is several nanometers and the amplification factor is approximately 10 dB.

The structure shown in FIG. 7 can also be used as a DFB laser. If current is injected solely into the electrode 12, the area without the diffraction grating $g_2$ will become a light absorbing area. Thus, a laser is obtained, one end surface of which does not reflect light. Therefore, even if no antireflection coating is provided, a single mode oscillation that suppresses the Fabry-Perot mode is achieved.

Second Embodiment

Figure 9:
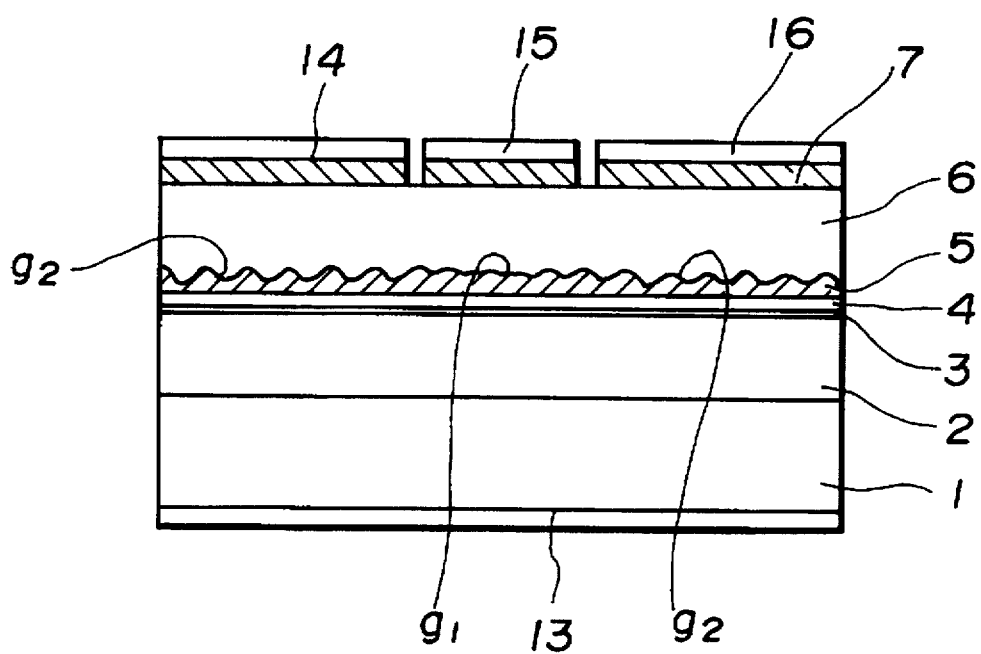
FIG. 9 is a cross-sectional view of a second embodiment of a semiconductor device according to the present invention.

FIG. 9 shows a tunable DBR laser which is a second embodiment of a device fabricated by the method of the present invention. In the second embodiment, an area having a shallow diffraction grating $g_1$ is located in a central region, and regions having ordinary diffraction gratings $g_2$ are arranged on both sides. In FIG. 9, portions having the same functions as those shown in FIG. 7 are designated by the same reference numerals. The second embodiment is also fabricated by a method which is essentially the same as that illustrated in FIGS. 8A–8G, with the exception that the stripe-shaped resist 9 (FIG. 8D) is located over the central portion in the fabrication method of the second embodiment.

The laser structure of the second embodiment is driven in the following manner: A laser driving current is injected into a center electrode 15, and the refractive index is changed by controlling the amount of current injected into electrodes 14 and 16. Thus; the oscillation wavelength is varied.

In turn, laser driving currents may be respectively injected into the electrodes 14 and 16, and the oscillation wavelength is varied by controlling a ratio between those currents. In this case, the average refractive index is changed by the currents injected into the electrodes 14 and 16, and the oscillation wavelength is thus varied. At the same time, the phase is adjusted by controlling the current injected into the electrode 15. In this structure, since the phase is adjusted by the electrode 15, a stable single mode oscillation is achieved even if no λ/4 shift area is formed in the diffraction grating $g_2$. As regards a method for producing a λ/r shift area, see, for example, Japanese laid-open application No. 2-40974.

Figure 10A:
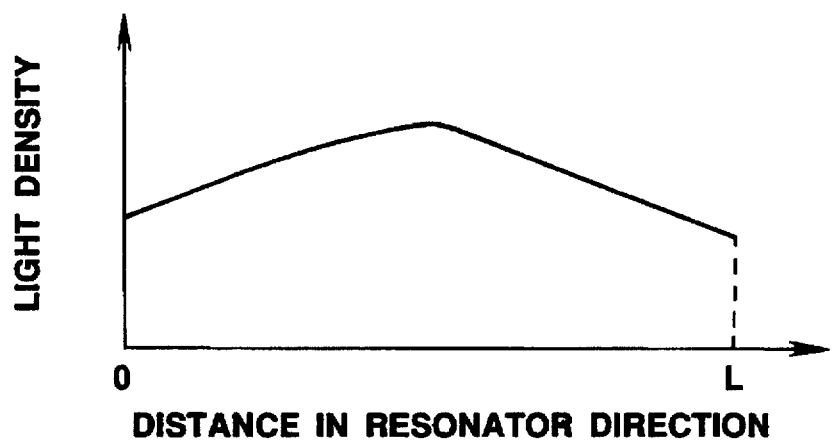
FIGS. 10A and 10B are graphs respectively light density distributions of a prior art distributed feedback (DFB) type laser and a second embodiment of a laser device according to the present invention.
Figure 10B:
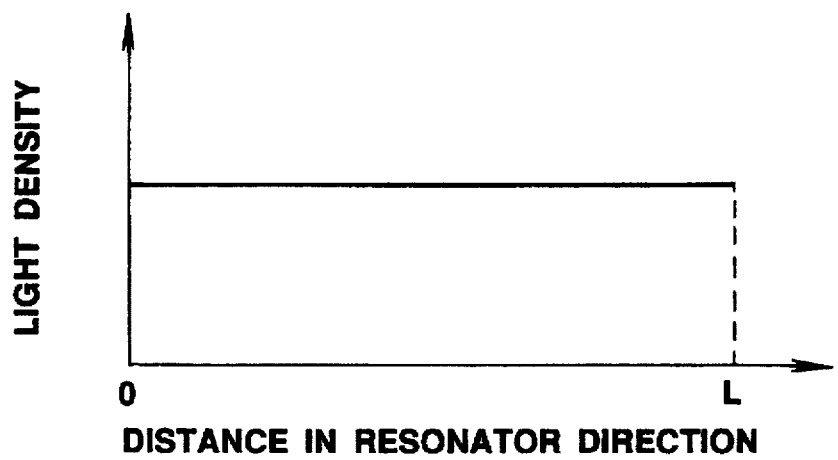

Further, though light or optical density is usually large at a central resonator portion as shown in FIG. 10A, the light density can be made approximately uniform along a reflector or resonator direction in this embodiment as illustrated in FIG. 10B since the coupling efficiency with the diffraction gratings $g_2$ near the end surfaces of the device, or diffraction efficiency, is large. As a result, the so-called longitudinal hole burning effect, in which the carrier density has a hollow portion, is reduced. Thus, the laser threshold can be reduced, a high-power output can be obtained and a narrow spectral line width of the oscillation spectrum is achieved.

If current, which is a little smaller than a laser threshold, is injected, this embodiment can also function as a tunable filter, in a manner similar to the first embodiment.

Third Embodiment

If the depth of the shallow diffraction grating g1 is set to about 100 Å in the laser structure of FIG. 7 (this can be achieved by adjusting the etching step of FIG. 8C), a laser that has characteristics of both a DFB and DBR can be obtained. This structure has been proposed by Arai et al. of Tokyo Technology Univ. (see, for example, J. I. Shin. et al. IEE J. Quantum Electron., June, 1991). This structure can be readily fabricated by the method of the present invention, and a laser, that has an excellent single mode characteristic and an improved efficiency can be obtained.

Fourth Embodiment

Figure 11:
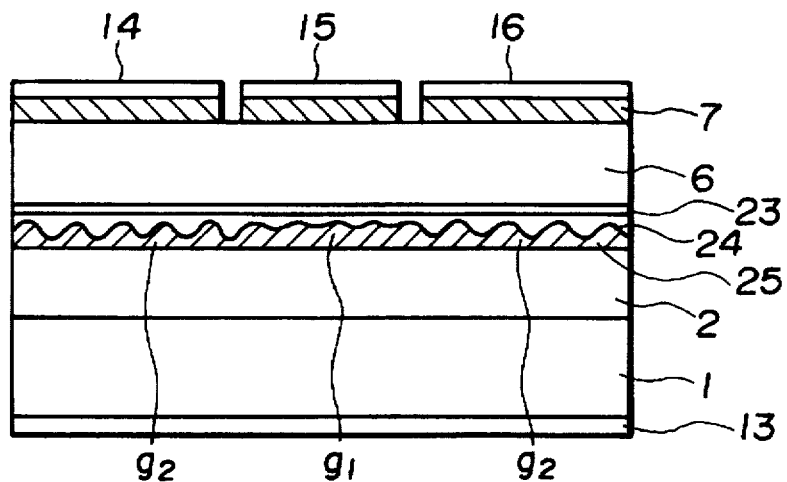
FIG. 11 is a cross-sectional view of a fourth embodiment of a semiconductor device according to the present invention.

FIG. 11 shows a fourth embodiment of the present invention. This embodiment has a structure which has fine and coarse diffraction gratings $g_1$ and $g_2$ beneath an active layer 23. Conventionally, it has been impossible to provide a region with such a diffraction grating and a region without a diffraction grating (i.e., substantially no grating) beneath the active layer 23 in devices fabricated of materials in the AlGaAs/GaAs series (see the description of FIG. 15 below).

In a first growth step, cladding layer 2 and light guide layer 25 are grown on a substrate 1. After the fabrication of diffraction gratings $g_1$ and $g_2$ (this is performed substantially according to the method illustrated in FIGS. 8A–8G), carrier confinement layer 24, active layer 23, cladding layer 6 and contact layer 7 are regrown. Thus, the fourth embodiment is fabricated.

In the case of such a fabrication method, process damage to the active layer 23 at the time of fabrication of the diffraction gratings, that has been conventionally a serious problem, can be solved since the active layer 23 is grown after the fabrication of the diffraction gratings. Further, a degree of freedom in design (depth of diffraction grating, composition of active layer, etc.) can be increased.

Fifth, Sixth and Seventh Embodiments

In a fifth embodiment, a grating or fine uneven structure in a region, where a regrowth is needed but not effective diffraction grating is needed, is shaped into a diffraction grating that has sufficiently short pitch so as not to attain diffraction effects for a wavelength of used light.

In a sixth embodiment, a diffraction grating is slanted with respect to a light propagation direction in a region where the regrowth is needed while no effective diffraction grating is needed, so that no diffraction effect acts on a wavelength of used light. The slanted diffraction grating is formed so that there are many crystal orientations which facilitate regrowth. The slanted diffraction grating can be formed by forming a diffraction rating resist pattern 8 that has a different configuration from that shown in FIGS. 8A–8G and etching the wafer with this resist pattern as a mask.

In a seventh embodiment, a diffraction grating is formed at a position sufficiently away from a waveguide structure, in a region where a regrowth is needed while no effective diffraction grating is necessary, so that no diffraction effect acts on light propagated along the light waveguide structure of a compound of a compound semiconductor device. To achieve such a structure, after a light guide layer 5 is formed to a sufficiently large thickness, and necessary and unnecessary diffraction gratings are formed thereon (see FIGS. 7 and 9), the necessary diffraction grating portion is isotropicly further etched with a protective resist 9 formed over the unnecessary diffraction grating used as a mask. Thus, only the necessary diffraction grating is caused to approach towards the waveguide structure.

Eighth Embodiment

Figure 12:
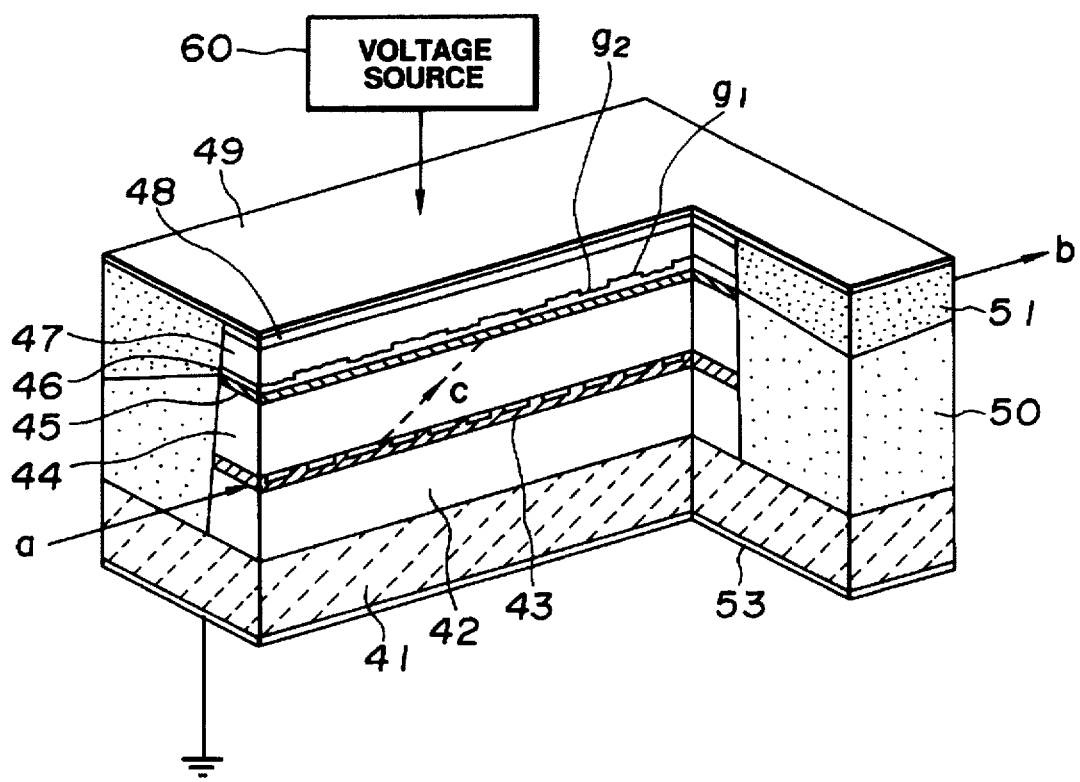
FIG. 12 is a partly cut-away perspective view of an eighth embodiment of a device according to the present invention.
Figure 13:
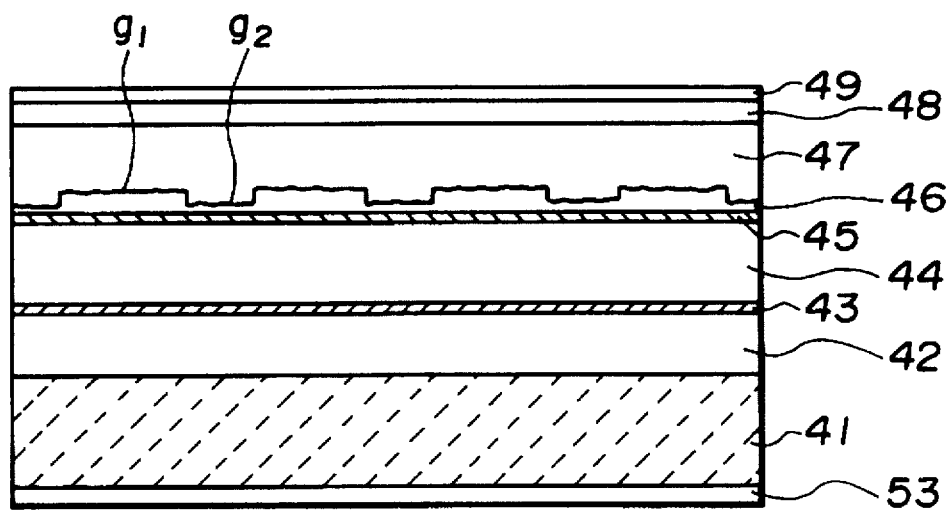
FIG. 13 is a cross-sectional view of the eighth embodiment of a device.

An eighth embodiment of the present invention, which is directed to a semiconductor grating filter, will be described with reference to FIGS. 12 and 13. FIG. 12 is a partly cut-away perspective view, and FIG. 13 is a cross-sectional view of FIG. 12.

The fabrication method of the eighth embodiment will be described. By using an MBE method, on an n-GaAs substrate 41, an n-GaAs buffer layer (not shown) of a thickness of 0.5 µm, an n-$Al_{0.5}Ga_{0.5}As$ cladding layer 42 of a thickness of 1.5 µm, a multiple quantum well (MQW) structure layer 43 consisting of nine sets or pairs of n-GaAs well layers (thickness: 30 Å)/$Al_{0.3}Ga_{0.7}As$ barrier layers (thickness: 80 Å), an n-$Al_{0.5}Ga_{0.5}As$ cladding layer 44 of a thickness of 1.0 µm, a multiple quantum well (MGW) structure layer 45 consisting of three sets or pairs of undoped GaAs well layers (thickness: 60 Å)/$Al_{0.2}Ga_{0.8}As$ barrier layers (thickness: 100 Å) and a p-$Al_{0.2}Ga_{0.8}As$ light guide layer 46 of a thickness of 0.25 µm are grown in this order.

Next, a coarse grating $g_1$ of a pitch of 10 µm (the length of a convex part is 7 µm and the length of a concave part is 3 µm) and a depth of 0.1 µm is formed on the light guide layer 46 by photolithography and RIBE etching. In a coupling region having a length of approximately 500 µm, when a light of a wavelength of about 830 nm is caused to enter a lower waveguide, whose center is MQW layer 43, along a direction of a shown in FIG. 12, the light path is completely shifted to a upper waveguide, whose center is MQW layer 45, and emitted along a direction of b. Therefore, the length of the coupling region is set to 500 µm in this embodiment.

A fine diffraction grating $g_2$ of a pitch of 200 nm and a depth of 30 Å is fabricated along the same direction as that of the coarse grating $g_1$. In other words, the fine diffraction grating $g_2$ is superposed on the coarse grating $g_1$. The fine grating $g_2$ is formed by forming a resist pattern by a two-beam interference exposure method and etching the wafer by an RIBE method. Then, a $Al_{0.5}Ga_{0.5}As$ cladding layer 47 of a thickness of 1.5 µm and a p-GaAs contact layer 48 of a thickness of 0.5 µm are formed on the light guide layer 46 by an LPE method. Due to the presence of the fine grating flat epitaxial crystalline growth can be achieved on the entire substrate or over a portion where regrowth is needed.

Then, after a $SiO_2$ film is deposited by, for example, magnetron sputtering and a resist is shaped into a stripe of a width of 1.5 µm, a mesa-etch is performed down to the GaAs substrate 41 by an RIBE method with the resist used as a mask. After the resist is removed, p-$Al_{0.5}Ga_{0.5}As$ 50 and n-$Al_{0.5}Ga_{0.5}As$ are selectively regrown using an LPE method, with the $SiO_2$ is removed, an upper electrode 49 of Cr/Au is deposited. Thereafter, the substrate 41 is lapped to a thickness of 100 µm, and a lower electrode 53 of Au-Ge/Au is deposited. After alloying, the device is completed.

In this embodiment, the pitch of the fine diffraction grating $g_2$ is set to a value that does not match a Bragg condition:

$$\Lambda = m\chi\lambda/(2n)$$

where m is an order of the diffraction grating, λ is a wavelength of propagated light and n is a refractive index.

For example, when the wavelength of the propagated light is 830 nm, the refractive index is 3.4 and the order of the grating is second, the non matching pitch will be set at about 200 nm since the matching pitch is equal to 244 nm.

The operation of this device will be described.

Figure 14:
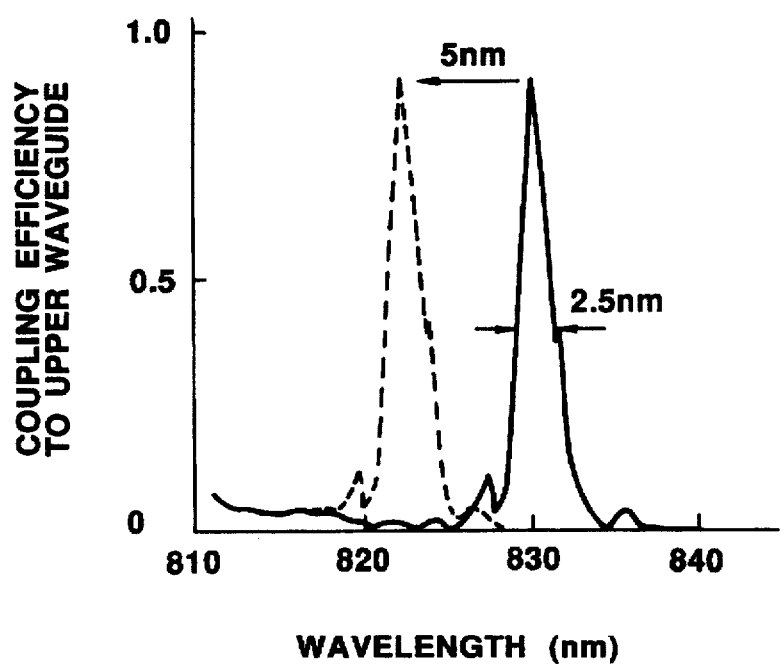
FIG. 14 is a graph showing a wavelength dependency of a coupling efficiency to an upper waveguide of the eighth embodiment of a device.

In a grating filter, a wavelength band, that can be coupled from the lower waveguide to the upper waveguide, can be selected by the grating pitch. The device has filter characteristics whose center wavelength is 830 nm and whose half width is 2.5 nm, as shown in FIG. 14. Further, the filter wavelength can be continuously shifted to a shorter value by about 5 nm by applying an electric field across the electrodes 49 and 53 by, for example, a voltage source 60. Thus, the coupling efficiency to the upper waveguide can be varied.

Ninth Embodiment

Figure 15:
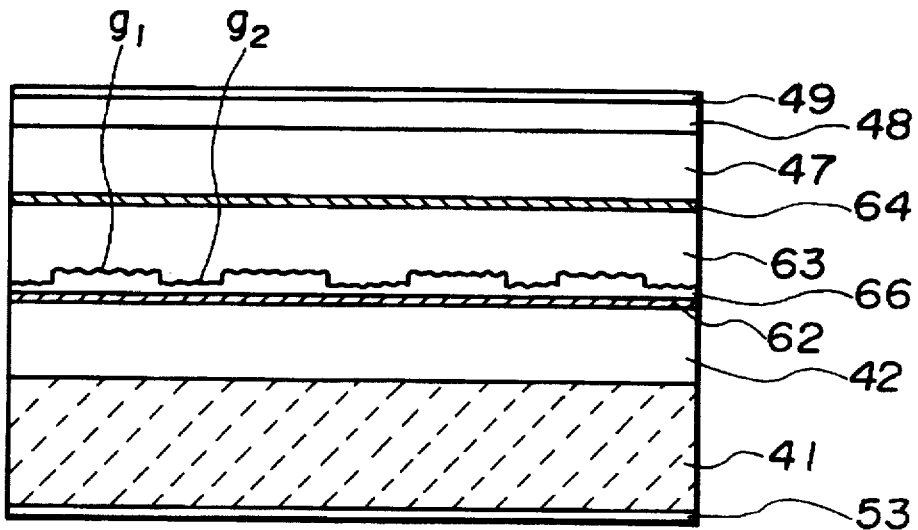
FIG. 15 is a cross-sectional view of a ninth embodiment of a device according to the present invention.

A ninth embodiment of the present invention, which is directed to a grating filter, will be described with reference to FIG. 15. While the grating is located in the vicinity of the upper waveguide in the eighth embodiment, a grating is formed in the vicinity of a lower waveguide in the ninth embodiment. Such a structure has been conventionally known in devices fabricated of materials in the InGaAsP/InP series (see, e.g., the above-mentioned article (1)), but such a structure cannot be fabricated from materials in the AlGaAs/GaAs series since regrowth on a grating having a coarse pitch is difficult for AlGaAs/GaAs structures. Such a regrowth is made possible according to the method of the present invention.

The advantage of the ninth embodiment, where the grating is formed in the region of the lower waveguide, is that light coupled to the upper waveguide will not be disturbed by the grating and hence no optical loss occurs. This leads to an excellent filtering efficiency.

The fabrication method of the ninth embodiment will be described. By using an MBE method, on an n-GaAs substrate 41, an n-GaAs buffer layer (not shown) of a thickness of 0.5 µm, and n-$Al_{0.5}Ga_{0.5}As$ be described. By using an MBE method, on an n-GaAs substrate 41, an n-GaAs buffer layer (not shown) of a thickness of 0.5 µm, an n-$Al_{0.5}Ga_{0.5}As$ cladding layer 42 of a thickness of 1.5 µm, a multiple quantum well (MQW) structure layer 62 consisting of nine sets of n-GaAs well layers (thickness: 30 Å)/$Al_{0.3}Ga_{0.7}As$ barrier layers (thickness: 80 Å), and a p-$Al_{0.2}Ga_{0.8}As$ light guide layer 66 of a thickness of 0.25 µm are grown in this order.

Next, a grating $g_1$ of a pitch of 10 µm (the length of a convex part is 7 µm and the length of a concave part is 3 µm) and a depth of 0.1 µm is formed on the light guide layer 66 by photolithography and RIBE patterning. Then, a fine diffraction grating $g_2$ of a pitch of 200 nm and a depth of 30 Å is fabricated along the same direction as that of the coarse grating $g_1$, in a manner similar to the eighth embodiment.

Then, a p$Al_{0.5}Ga_{0.5}As$ cladding layer 63 of a thickness of 1.0 µm, a p-$Al_{0.2}Ga_{0.8}As$ light guide layer 64 of a thickness of 0.1 µm, a p-$Al_{0.2}Ga_{0.8}As$ cladding layer 47 of a thickness of 1.0 µm, and a p-GaAs contact layer 48 of a thickness of 0.5 µm are formed on the light guide layer 66 by a LPE method. Also in this case, due to the presence of the fine grating $g_2$, flat epitaxial crystalline growth can be readily achieved over the entire surface. The fabrication process thereafter is the same as that of the eighth embodiment.

Also in this embodiment, the pitch of the fine diffraction grating $g_2$ is set to a value that does not match a Bragg condition.

Tenth Embodiment

Figure 16:
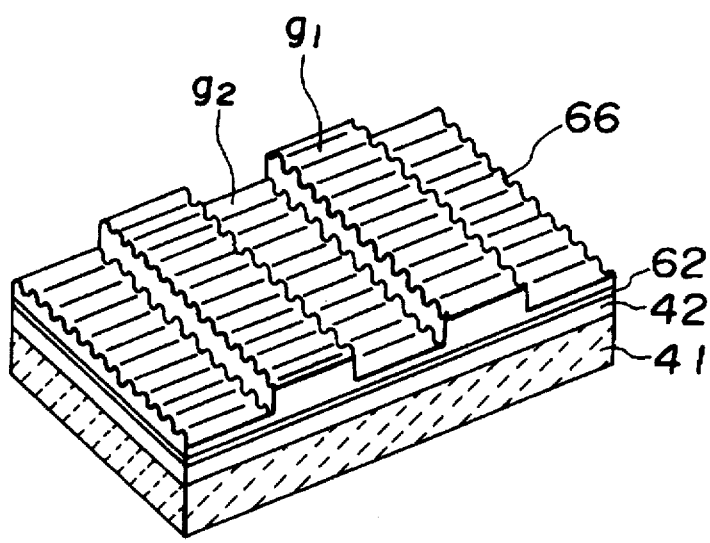
FIG. 16 is a perspective view of a tenth embodiment of device according to the present invention.

A tenth embodiment of the present invention, which is directed to a grating filter, will be described with reference to FIG. 16. While the fine grating $g_2$ for facilitating regrowth by a LPE method is formed along the same direction as that of the coarse grating $g_1$ which functions as the grating filter, in the eighth and ninth embodiments, a fine grating $g_2$ is formed along a direction perpendicular to the direction of the coarse grating $g_1$, for further reducing light scattering caused by the fine grating $g_2$, in the tenth embodiment.

The construction of the device and the fabrication method of the tenth embodiment are substantially the same as those of the eighth or ninth embodiment.

As described in the foregoing, according to the present invention, devices such as semiconductor lasers of constructed of materials in the GaAs/AlGaAs series, which include a diffraction grating portion having a different coupling efficiency, can be readily fabricated. Thus, light sources, filters, etc., which have advantageous tunability characteristics and high-power output characteristics and are usable in the fields of wavelength division multiplexing communications and measurements, can be realized. Further, when material regrowth must be performed after a first material growth, regrowth can be accurately performed over a desired portion or region without difficulty.

Further, according to the present invention, devices such as semiconductor-layer type grating filters constructed of AlGaAs/GaAs, in which regrowth over a processed substrate is needed, can be easily produced. Thereby, a degree of design freedom in devices of ALGaAs/GaAs is increased, and various devices having novel functions can be developed.

Except as otherwise disclosed herein, the various components shown in outline or in block form in the figures are individually well-known in their internal construction and operation and are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the spirit and scope if the appended claims.

What is claimed is:

1. An optical compound semiconductor device comprising:

a semiconductor substrate;

a first growth epitaxial-layer structure formed on said substrate, said first growth epitaxial-layer structure having an epitaxial crystal surface;

at least one kind of fine uneven structure formed on the entire epitaxial crystal surface of said first growth epitaxial-layer structure; and a second growth epitaxial-layer structure formed on said fine uneven structure, wherein said at least one kind of fine uneven structure includes a first fine uneven structure which has an unevenness small enough to produce substantially zero diffraction effect on any wavelength of light used in said device, and said first fine uneven structure defines a plurality of surfaces having crystal orientations which are respectively different from a crystal orientation of said first growth epitaxial-layer structure, said plurality of surfaces being adapted to facilitate growth of said second growth epitaxial-layer structure.

2. An optical compound semiconductor device according to claims 1, wherein said first growth epitaxial-layer structure is formed in a first growth step, said fine uneven structure is formed in an interruption step performed after once interrupting the first growth step and said second growth epitaxial-layer structure is formed in a second growth step performed after the interruption step.

3. An optical compound semiconductor device according to claim 1, wherein said at least one kind of fine uneven structure comprises a plurality of portions of different fine uneven structures formed on the entire epitaxial crystal surface of said first growth epitaxial-layer structure.

4. An optical compound semiconductor device according to claim 1, wherein said at least one kind of fine uneven structure comprises a plurality of diffraction gratings of predetermined pitches.

5. An optical compound semiconductor device according to claim 1, wherein said first fine uneven structure is sufficiently shallow that said first fine uneven structure has substantially zero substantial diffraction effect for any wavelength of light used in said device.

6. An optical compound semiconductor device according to claim 1, wherein said first fine uneven structure comprises a diffraction grating of a short pitch which has substantially zero diffraction effect for any wavelength of light used in said device.

7. An optical compound semiconductor device according to claim 1, further comprising a light waveguide structure, and wherein said first fine uneven structure is formed sufficiently away from said light waveguide structure that said first fine uneven structure has substantially zero diffraction effect for light propagated in said waveguide structure.

8. An optical compound semiconductor device according to claim 1, wherein said first growth epitaxial-layer structure comprises $Al_xGa_{1-x}As$ where $0<x<1$ or $x=1$.

9. An optical compound semiconductor device according to claim 1, further comprising an active layer in said first growth epitaxial-layer structure.

10. An optical compound semiconductor device according to claim 1, further comprising an active layer in said second growth epitaxial-layer structure.

11. An optical compound semiconductor device according to claim 1, wherein said first fine uneven structure comprises a diffraction grating which is slanted with respect to a direction of light propagated in said device so that said first fine uneven structure has substantially zero diffraction effect for any wavelength of light used in said device.

12. A compound semiconductor device comprising:
  a semiconductor substrate;
  a first growth epitaxial-layer structure formed on said substrate, said first growth epitaxial-layer structure having an epitaxial crystal surface;
  at least one kind of fine uneven structure formed on the entire epitaxial crystal surface of said first growth epitaxial-layer structure, wherein said at least one kind of fine uneven structure comprises at least a diffraction grating which is slanted with respect to a light propagation direction of light propagated in said device so that the diffraction grating has substantially zero diffraction effect for the light; and
  a second growth epitaxial-layer structure formed on said fine uneven structure.

13. A distributed feedback type laser semiconductor device comprising:
  a semiconductor substrate;
  a first growth epitaxial-layer structure formed on said substrate, said first growth epitaxial-layer structure having an epitaxial crystal surface;
  a plurality of kinds of fine uneven structures formed on the entire epitaxial crystal surface of said first growth epitaxial-layer structure;
  a second growth epitaxial-layer structure formed on said plurality of kinds of fine uneven structures; and
  an active region formed in one of said first and second growth epitaxial-layer structures,
  wherein at least one of said plurality of kinds of fine uneven structures has an unevenness too small to produce any substantial diffraction effect on any wavelength of light used in said device, and said at least one of said plurality of kinds of uneven structures defines a plurality of surfaces having crystal orientations which are respectively different from a crystal orientation of said first growth epitaxial-layer structure, said plurality of surfaces being adapted to facilitate growth of said second growth epitaxial-layer structure, and another of said plurality of kinds of fine uneven structures is a diffraction grating comprising a distributed feedback reflector and is sufficiently uneven to have a diffraction effect on a wavelength of light to be used in said device.

14. A distributed feedback type laser semiconductor device according to claim 13, further comprising electrode means for independently controlling currents injected into said another of said plurality of kinds of fine uneven structures.

15. A distributed feedback type semiconductor laser according to claim 13, wherein said first growth epitaxial-layer structure comprises $Al_xGa_{1-x}As$ where $0<x<1$ or $x=1$.

16. A distributed Bragg reflection type laser semiconductor device comprising:
  a semiconductor substrate;
  a first growth epitaxial-layer structure formed on said substrate, said first growth epitaxial-layer structure having an epitaxial crystal surface;
  a plurality of kinds of fine uneven structures formed on the entire epitaxial crystal surface of said first growth epitaxial-layer structure;
  a second growth epitaxial-layer structure formed on said plurality of kinds of fine uneven structures; and
  an active region formed in one of said first and second growth epitaxial-layer structures,
  wherein at least one of said plurality of kinds of fine uneven structures has an unevenness small enough to produce substantially zero diffraction effect on any wavelength of light used in said device, and said at least one of said plurality of kinds of fine uneven structures defines a plurality of surfaces having crystal orientations which are respectively different from a crystal orientation of said first growth epitaxial-layer structure, said plurality of surfaces being adapted to facilitate growth of said second growth epitaxial-layer structure, and another of said plurality of kinds of fine uneven structures comprises a diffraction grating comprising a distributed Bragg reflector and is sufficiently uneven to have a diffraction effect on a wavelength of light to be used in said device.

17. A distributed Bragg reflection type laser semiconductor device according to claim 16, further comprising electrode means for independently controlling currents injected into said another of said plurality of kinds of fine uneven structures.

18. A distributed Bragg reflection type semiconductor laser device according to claim 16, wherein said first growth epitaxial-layer structure comprises $Al_xGa_{1-x}As$ where $0<x<1$ or $x=1$.

19. An optical compound semiconductor device comprising:
  a semiconductor substrate;
  a first growth epitaxial-layer structure formed on said substrate, said first growth epitaxial-layer structure having an epitaxial crystal surface;
  at least two kinds of fine uneven structures formed on said entire epitaxial crystal surface of said first growth epitaxial-layer structure; and a second growth epitaxial-layer structure formed on said fine uneven structures, wherein said at least two kinds of fine uneven structures include a first fine uneven structure which has an unevenness small enough to produce substantially zero diffraction effect on any wavelength of light used in said device, and said first fine uneven structure defines a plurality of surfaces having crystal orientations which are respectively different from a crystal orientation of said first growth epitaxial-layer structure, said plurality of surfaces being adapted to facilitate growth of said second growth epitaxial-layer structure.

20. An optical compound semiconductor device according to claim 19, wherein said at least two kinds of fine uneven structures comprise a plurality of diffraction gratings of predetermined pitches.

21. An optical compound semiconductor device according to claims 19, wherein said first fine uneven structure is sufficiently shallow that said first fine uneven structure has substantially zero diffraction effect for any wavelength of light used in said device.

22. An optical compound semiconductor device according to claim 19, wherein said first fine uneven structure comprises a diffraction grating of a short pitch which has substantially zero diffraction effect for any wavelength of light used in said device.

23. An optical compound semiconductor device according to claim 19, wherein said first growth epitaxial-layer structure comprises $Al_xGa_{1-x}As$ where $0<x<1$ or $x=1$.

24. An optical compound semiconductor device according to claim 19, further comprising a light waveguide and wherein said first fine uneven structure satisfies at least one condition of four conditions, (1) that said first fine uneven structure is sufficiently shallow that said first fine uneven structure has substantially zero diffraction effect for any wavelength of light used in said device, (2) that said first fine uneven structure comprises a diffraction grating of a short pitch which has substantially zero diffraction effect for any wavelength of light used in said device, (3) that said first fine uneven structure comprises a diffraction grating which is slanted with respect to a direction of light propagated in said light waveguide so that said first fine uneven structure has substantially zero diffraction effect for any wavelength of light used in said device, and (4) that said first fine uneven structure is formed sufficiently away from said light waveguide structure so that said first fine uneven structure has substantially zero diffraction effect for light propagated in said waveguide structure.

25. An optical compound semiconductor device according to claim 19, wherein said first fine uneven structure comprises a diffraction grating which is slanted with respect to a direction of light propagated in said device so that said first fine uneven structure has substantially zero diffraction effect for any wavelength of light used in said device.

26. An optical compound semiconductor device according to claim 19, wherein said first fine uneven structure comprises a diffraction grating which has substantially zero diffraction effect for any wavelength of light used in said device, and said at least two kinds of fine uneven structures further comprise a second diffraction grating which has a diffraction effect for a wavelength of light used in said device, and said first fine uneven structure is superposed on said second diffraction grating.

27. A compound semiconductor device comprising:
a semiconductor substrate;
a first growth epitaxial-layer structure formed on said substrate, said first growth epitaxial-layer structure having an epitaxial crystal surface;

at least two kinds of fine uneven structures on said epitaxial crystal surface of said first growth epitaxial-layer structure, said fine uneven structures being superposed on the common epitaxial crystal surface, wherein said fine uneven structures comprise at least a diffraction grating which is slanted with respect to a light propagation direction of light propagated in the said device so that the diffraction grating has substantially zero diffraction effect for any wavelength of a used light; and a second growth epitaxial-layer structure formed on said fine uneven structures.

28. A compound semiconductor device comprising:
a semiconductor substrate;
a first growth epitaxial-layer structure formed on said substrate, said first growth epitaxial-layer structure having an epitaxial crystal surface;

at least two kinds of fine uneven structures on said epitaxial crystal surface of said first growth epitaxial-layer structure, said fine uneven structures being superposed on the common epitaxial crystal surface, wherein said fine uneven structures comprise at least an uneven portion which satisfies at least two conditions of three conditions that said uneven portion is so shallow that said uneven portion has substantially zero diffraction effect for a wavelength of any used light, that said uneven portion has a short pitch which has substantially zero diffraction effect for any wavelength of a used light, and that said uneven portion is slanted with respect to a light propagation direction of light propagated in said device so that said uneven portion has substantially zero diffraction effect for any wavelength of a used light; and a second growth epitaxial-layer structure formed on said fine uneven structures.

29. A compound semiconductor device comprising:
a semiconductor substrate;
a first growth epitaxial-layer structure formed on said substrate, said first growth epitaxial-layer structure having an epitaxial crystal surface;

at least two kinds of fine uneven structures on said epitaxial crystal surface of said first growth epitaxial-layer structure, said fine uneven structures being superposed on the common epitaxial crystal surface; and a second growth epitaxial-layer structure formed on said fine uneven structures; and a light waveguide, wherein said fine uneven structures comprise a main diffraction grating which has a pitch for imparting a diffraction effect for light propagated in said light waveguide and a sub-diffraction grating which has a pitch for imparting a smaller diffraction effect for the propagated light than said main diffraction grating and is superposed on said main diffraction grating, and wherein said sub-diffraction grating satisfies at least one condition of three conditions that said sub-diffraction grating is so shallow that said sub-diffraction grating has substantially zero diffraction effect for any wavelength of a used light, that said sub-diffraction grating has a short pitch which has substantially zero diffraction effect for any wavelength of a used light, and that said sub-diffraction grating is slanted with respect to a light propagation direction of light propagated in said light waveguide so that said sub-diffraction grating has substantially zero diffraction effect for any wavelength of a used light, and wherein a plurality of said light waveguides are layered in a layering direction with a predetermined coupling efficiency, said main and sub-diffraction gratings are formed in the vicinity of one of said light waveguides and electrode means is formed to change a wavelength selectivity between the coupled light waveguides.

30. A compound semiconductor device comprising:

a semiconductor substrate;

a first growth epitaxial-layer structure formed on said substrate, said first growth epitaxial-layer structure having an epitaxial crystal surface;

at least two kinds of fine uneven structures on said epitaxial crystal surface of said first growth epitaxial-layer structure, said fine uneven structures being superposed on the common epitaxial crystal surface; and a second growth epitaxial-layer structure formed on said fine uneven structures; and a light waveguide, wherein said fine uneven structures comprise a main diffraction grating which has a pitch for imparting a diffraction effect for light propagated in said light waveguide and a sub-diffraction grating which has a pitch for imparting a smaller diffraction effect for the propagated light than said main diffraction grating and is superposed on said main diffraction grating, and wherein said sub-diffraction grating satisfies at least one condition of three conditions that said sub-diffraction grating is so shallow that said sub-diffraction grating has substantially zero diffraction effect for any wavelength of a used light, that said sub-diffraction grating has a short pitch which has substantially zero diffraction effect for any wavelength of a used light, and that said sub-diffraction grating is slanted with respect to a light propagation direction of light propagated in said light waveguide so that said sub-diffraction grating has substantially zero diffraction effect for any wavelength of a used light, and wherein the pitch of said main diffraction grating is more than ten times the wavelength of the propagated light and the pitch of said sub-diffraction grating is less than the wavelength of the propagated light.

31. An optical compound semiconductor device comprising:

a semiconductor substrate;

a first growth epitaxial-layer structure formed on said substrate, said first growth epitaxial-layer structure having an epitaxial crystal surface;

at least one kind of fine uneven structure formed on the entire epitaxial crystal surface of said first growth epitaxial-layer structure;

a second growth epitaxial-layer structure formed on said fine uneven structure;

wherein said at least one kind of fine uneven structure includes a first fine uneven structure, and said first fine uneven structure satisfies at least one condition of the four conditions shown below so that said first fine uneven structure produces substantially zero diffraction effect on any wavelength of light used in said device, (1) that said first fine uneven structure is sufficiently shallow, (2) that said first fine uneven structure is a grating whose pitch is sufficiently shorter than any wavelength of light used in said device, (3) that said first fine uneven structure is a grating which is slanted with respect to a direction in which light is propagated in said device, and (4) that said device further comprises a light waveguide structure and said first fine uneven structure is formed sufficiently away from said light waveguide structure, and wherein said first uneven structure defines a plurality of surfaces having a crystal orientations which are respectively different from a crystal orientation of said first growth epitaxial-layer structure, said plurality of surfaces facilitating growth of said second growth epitaxial-layer structure.

32. An optical compound semiconductor device according to claim 31, wherein said first growth epitaxial-layer structure is formed in a first growth step, said fine uneven structure is formed in an interruption step performed after once interrupting the first growth step and said second growth epitaxial-layer structure is formed in a second growth step performed after the interruption step.

33. An optical compound semiconductor device according to claim 31, wherein said device comprises an active region.

34. An optical compound semiconductor device according to claim 31, wherein said at least one kind of fine uneven structure includes a diffraction grating having a substantial diffraction effect for at least any wavelength of light used in said device.

35. An optical compound semiconductor device according to claim 34, wherein said diffraction grating functions as a distributed feedback reflector.

36. An optical compound semiconductor device according to claim 34, wherein said diffraction grating functions as a distributed Bragg reflector.

37. An optical compound semiconductor device according to claim 34, further comprising electrode means for independently controlling currents injected into said diffraction grating.

38. An optical compound semiconductor device according to claim 34, wherein said diffraction grating and said first fine uneven structure are superposed on the common epitaxial crystal surface.

39. An optical compound semiconductor device according to claim 34, wherein said device comprises a plurality of light waveguide structures, said plurality of light waveguide structures being layered in a layering direction with a predetermined coupling efficiency, and said device further comprising electrode means for changing a wavelength selectivity of light to be coupled between said plurality of light waveguide structures.

40. An optical compound semiconductor device according to claim 31, wherein said first growth epitaxial-layer structure comprises $Al_xGa_{1-x}As$ where $0<X<1$ or $X=1$.

41. An optical compound semiconductor device according to claim 31, wherein said first fine uneven structure is a sinusoidal shaped grating.

* * * * *

UNITED STATES PATENT AND TRADEMARK OFFICE
CERTIFICATE OF CORRECTION

PATENT NO. : 5,701,325
DATED : December 23, 1997
INVENTOR(S) : TOSHIHIKO OUCHI ET AL.

Page 1 of 3

It is certified that error appears in the above-identified patent and that said Letters Patent is hereby corrected as shown below:

ON THE TITLE PAGE AT [56]
  FOREIGN PATENT DOCUMENTS, "3248492" should read
     --3-248492--; and "5343791" should read --5-343791--.

COLUMN 1
  Line 29, "a" should read --an--.

COLUMN 4
  Line 56, "light" should read --of light--.

COLUMN 5
  Line 6, "of" should read --of the--;
  Line 22, "if" should read --is--;
  Line 53, "by" should read --be--.

COLUMN 6
  Line 40, "Thus;" should read --Thus,--.

COLUMN 7
  Line 2, "g1" should read --$g_1$--;
  Line 7, "IEE" should read --IEEE--.

COLUMN 8
  Line 25, "a" should read --an--;
  Line 34, "a" should read --an--;
  Line 38, "grating" should read --grating $g_2$,--;
  Line 47, "with" should be deleted and "an" should read --and
     an--;

UNITED STATES PATENT AND TRADEMARK OFFICE
CERTIFICATE OF CORRECTION

PATENT NO. : 5,701,325

DATED : December 23, 1997

INVENTOR(S) : TOSHIHIKO OUCHI ET AL.

It is certified that error appears in the above-identified patent and that said Letters Patent is hereby corrected as shown below:

COLUMN 8 (Cont.)
  Line 61, "non matching" should read --non-matching--.

COLUMN 9
  Line 43, "pAl$_{0.5}$Ga$_{0.5}$As" should read --p-Al$_{0.5}$Ga$_{0.5}$As--.

COLUMN 10
  Line 17, "ALGaAs/GaAs" should read --AlGaAs/GaAs--;
  Line 57, "claims" should read --claim--.

COLUMN 11
  Line 8, "substantial" should be deleted;
  Line 46, "With" should read --with--;
  Line 67, "too small" should read --small enough--.

UNITED STATES PATENT AND TRADEMARK OFFICE
CERTIFICATE OF CORRECTION

PATENT NO. : 5,701,325

DATED : December 23, 1997

INVENTOR(S) : TOSHIHIKO OUCHI ET AL.

It is certified that error appears in the above-identified patent and that said Letters Patent is hereby corrected as shown below:

COLUMN 12
  Line 1, "any substantial" should read --substantially zero--.

COLUMN 16
  Line 13, "a" should be deleted.

Signed and Sealed this

Seventeenth Day of November, 1998

Attest:

BRUCE LEHMAN

Attesting Officer     Commissioner of Patents and Trademarks